(12) United States Patent
Yamada (10) Patent No.: US 8,238,165 B2
(45) Date of Patent: Aug. 7, 2012

(54) WORD LINE DRIVERS IN NON-VOLATILE MEMORY DEVICE AND METHOD HAVING A SHARED POWER BANK AND PROCESSOR-BASED SYSTEMS USING SAME

(75) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 13/007,361

(22) Filed: Jan. 14, 2011

(65) Prior Publication Data

US 2011/0110163 A1 May 12, 2011

Related U.S. Application Data

(62) Division of application No. 12/572,957, filed on Oct. 2, 2009, now Pat. No. 7,872,920, which is a division of application No. 11/652,817, filed on Jan. 12, 2007, now Pat. No. 7,609,559.

(51) Int. Cl.
G11C 16/06 (2006.01)
(52) U.S. Cl. .............................. 365/185.23; 365/185.18
(58) Field of Classification Search ............. 365/185.23, 365/185.18
See application file for complete search history.

(56) References Cited

U.S. PATENT DOCUMENTS

| | | | |
|---|---|---|---|
| 5,371,697 A | 12/1994 | Yamada | 365/185.23 |
| 5,708,602 A | 1/1998 | Yamada | 365/185.2 |
| 5,995,406 A | 11/1999 | Kraus et al. | 365/145 |
| 6,091,623 A | 7/2000 | Kang | 365/185.23 |
| 6,147,906 A | 11/2000 | Bill et al. | 365/185.14 |
| 6,324,108 B1 | 11/2001 | Bill et al. | 365/201 |
| 6,400,638 B1 | 6/2002 | Yamada et al. | 365/230.06 |
| 6,438,041 B1 | 8/2002 | Yamada et al. | 365/189.09 |
| 6,462,998 B1 | 10/2002 | Proebsting | 365/205 |
| 6,587,375 B2 | 7/2003 | Chung et al. | 365/185.13 |
| 6,594,181 B1 | 7/2003 | Yamada | 365/185.21 |
| 6,621,742 B1 | 9/2003 | Yamada | 365/185.22 |
| 6,781,884 B2 | 8/2004 | Yamada | 365/185.22 |
| 6,781,915 B2 | 8/2004 | Arimoto et al. | 365/185.23 |
| 6,807,103 B2 | 10/2004 | Cavaleri et al. | 365/185.23 |
| 6,816,423 B2 | 11/2004 | Yamada | 365/203 |
| 6,839,279 B2 | 1/2005 | Yamada | 365/185.2 |
| 6,912,160 B2 | 6/2005 | Yamada | 365/185.2 |
| 7,009,881 B2 | 3/2006 | Noguchi | 365/185.17 |
| 7,085,162 B2 | 8/2006 | Nakamura et al. | 365/185.17 |
| 2002/0048193 A1* | 4/2002 | Tanikawa et al. | 365/185.33 |
| 2003/0169623 A1 | 9/2003 | Yamada | 365/185.22 |
| 2003/0202411 A1 | 10/2003 | Yamada | 365/203 |
| 2003/0206446 A1 | 11/2003 | Yamada | 365/185.24 |
| 2004/0179396 A1 | 9/2004 | Yamada | 365/185.2 |
| 2004/0246784 A1 | 12/2004 | Yamada | 365/189.07 |
| 2005/0201159 A1 | 9/2005 | Yamada | 365/185.23 |
| 2005/0213385 A1* | 9/2005 | Hosono et al. | 365/185.17 |
| 2005/0213388 A1 | 9/2005 | Yamada | 365/185.22 |

(Continued)

*Primary Examiner* — Tuan T. Nguyen
(74) *Attorney, Agent, or Firm* — Dorsey & Whitney LLP (57) ABSTRACT

A word line driver system that utilizes a voltage selection circuit to supply one of several voltages to an output node coupled to a plurality of word line control circuits. Each word line control circuit is coupled to a respective word line in an array of non-volatile memory cells. The voltage selection circuit may include selectable low pass filters for filtering the supplied voltage supplied to the word lines in the array of memory cells without significantly increasing the overall die-size of the device.

20 Claims, 6 Drawing Sheets

U.S. PATENT DOCUMENTS

| | | | |
|---|---|---|---|
| 2006/0077736 A1 | 4/2006 | Nakagawa et al. | 365/201 |
| 2006/0176742 A1 | 8/2006 | Yamada | 365/189.05 |
| 2007/0258301 A1* | 11/2007 | Del Gatto | 365/203 |
| 2007/0279999 A1 | 12/2007 | Watanabe et al. | 365/185.23 |
| 2008/0037185 A1* | 2/2008 | Tagami et al. | 360/327 |
| 2009/0080263 A1* | 3/2009 | Lee et al. | 365/185.19 |
| 2010/0172172 A1* | 7/2010 | Kim et al. | 365/148 |

* cited by examiner

WORD LINE DRIVERS IN NON-VOLATILE MEMORY DEVICE AND METHOD HAVING A SHARED POWER BANK AND PROCESSOR-BASED SYSTEMS USING SAME

CROSS-REFERENCE TO RELATED APPLICATIONS

This application is a divisional of U.S. patent application Ser. No. 12/572,957, filed Oct. 2, 2009, and issued as U.S. Pat. No. 7,872,920 B2 on Jan. 18, 2011, which is a divisional of U.S. patent application Ser. No. 11/652,817, filed Jan. 12, 2007, and issued as U.S. Pat. No. 7,609,559 B2 on Oct. 27, 2009. These applications and patents are each incorporated herein by reference, in their entirety, for any purpose.

TECHNICAL FIELD

Embodiments of the invention relate to non-volatile memory devices, and, more particularly, to non-volatile memory device word line drivers.

BACKGROUND OF THE INVENTION

Figure 1:
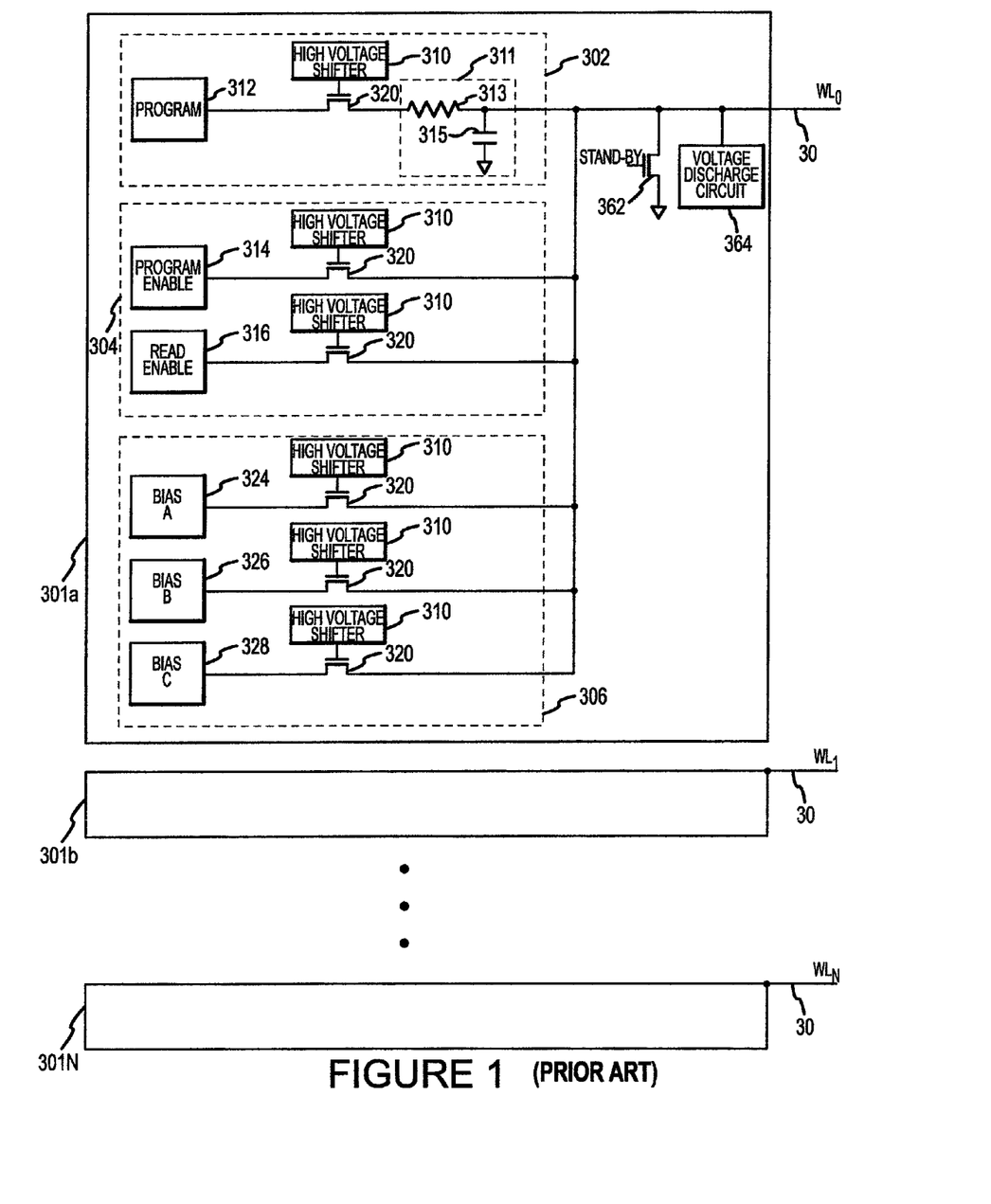
FIG. 1 is a block diagram showing a circuit of a plurality of prior art word line drivers, each word line driver being respectively coupled to a word line.

A prior art flash memory device includes a memory array containing a large number of flash memory cells divided into a number of blocks. The voltage on each of the word lines is controlled by a word line driver to program, erase or read the memory cells in the respective row. FIG. 1 shows a block diagram of a circuit that includes one of several prior art word line drivers 301 that would normally be used in a row decoder (not shown) to couple one of several possible voltages to a respective word line 30. Thus, respective word line drivers 301 are provided for all of the word lines 30 in a block. Each word line driver 301a-301N includes several voltage nodes 312-328 that are coupled to receive a supply voltage having a respective magnitude. The voltage nodes 312-328 are coupled to the respective word line 30 through a switch 320 enabled in accordance with the operation of the selected row of memory cells. The switches 320 are NMOS transistors controlled by a high voltage shifter 310, such as a charge pump circuit (not shown) or by other means known to one skilled in the art. When enabled, the high voltage shifter 310 provides a voltage to turn ON the transistor switch 320 and couple the respective voltage nodes 312-328 to the selected word line 30. Additionally, each driver 301 includes a stand-by switch 362 and a voltage discharge circuit 364 coupled to the word line 30. The stand-by switch 362 is enabled when the memory block is inactive, and disabled when the memory block receives a command for a memory operation. The voltage discharge circuit 364, which conventionally includes a high impedance for causing any voltage capacitively stored on the respective word line 30, including voltage stored on capacitors coupled to the word line 30 such as a capacitor 315 (which is discussed further below), to be gradually discharged after a memory operation is complete to prepare for the next command.

The word line driver 301 includes a program block 302 to apply a programming voltage to one of the word line 30 selected for programming during a programming operation, a read block 306 to apply one of several read voltages to a word line 30 selected for reading during a read operation, and an enable block 304 to apply one of two enable voltages to a non-selected word line 30 during either a programming or reading operation. The program voltage supplied by the program block 302 must be sufficiently large to store charge on the floating gate when the selected memory cell is programmed. When the switch 320 is enabled, the program node 312 is coupled in series with a resistor 313 and a capacitor 315, which in combination act as a low pass filter 311 that filters the supplied voltage before the voltage is applied to the word line 30. The low pass filter 311 is used as a delay element to minimize disturbances due to word line-to-word line coupling when the signal applied to the word line 30 transitions to a high voltage level or a low voltage level. During the program operation, the enable block 304 applies a program enable voltage from the program enable node 314 to a respective one of the word lines 30 that is not selected for programming. As described above, a voltage sufficient to turn on all the unselected memory cells 14 must be applied to the word lines 30 of the other rows to program the selected row.

Similarly, during a read operation, the read block 306 applies a read voltage to a respective word line 30 that is selected for reading. Since the memory cell is capable of storing multiple bits of data at multiple levels of charge on its floating gate, several read voltages are made available through multiple bias voltage nodes 324-328. For example, since a 2-bit multilevel memory cell 14 may be programmed to one of four threshold voltage levels, three read voltages are used to read data from one of four possible states (0,0), (0,1), (1,0), (1,1). Bias voltage node A 324 may provide a voltage level for discriminating between states (0,0) or (0,1), the voltage level provided to the bias voltage node B 326 may be used to read states (0,1) or (1,0), and the voltage level provided to the bias voltage node C 328 may be used to read states (1,0) or (1,1). During the read operation, the enable block 304 applies a read enable voltage from the read enable node 316 to a respective one of the word lines 30 if the word line is not selected for reading to turn on the memory cells 14 of the non-selected rows as previously described.

As mentioned above, respective word line drivers 301 must be provided for all of the word lines 30 in a block. Therefore, for a block containing 32 rows of memory cells, 32 word line drivers 301 must be provided. The area on a semiconductor die that must be devoted to such word line drivers is further increased by the use of the multilevel memory cell in the flash memory block 10 since more voltage levels must be supplied by each of the word line drivers 301 as more bits are stored in the memory cells. Specifically, each additional voltage that is supplied requires an additional voltage node to incorporate in the word line driver 301 circuitry or by some other circuitry. Therefore, as the number of read voltages supplied to the select memory cells increases, each of the drivers 301 require additional circuitry. Therefore, the memory chip must accommodate a greater number of the larger drivers 301, resulting in a much larger die size. For example, the word line driver 301a shown in FIG. 1 requires 7 transistors 320, 1 low-pass filter 311, 6 high voltage shifters 310 and 1 voltage discharge circuit 364. A block of memory cells having 32 rows would therefore require 224 (7*32) transistors 320, 7 low-pass filters 311, 192 (6*32) high voltage shifters, and 7 voltage discharge circuits 364. This large number of components can require a significant amount of area on a semiconductor die, thus increasing the cost of non-volatile memory devices having row decoders that use the word line drivers 301.

There is therefore a need for a non-volatile memory device and method that reduces the circuit size of the word line drivers 301 to reduce the overall die size of the memory chip.

DETAILED DESCRIPTION

Embodiments of the present invention are directed to non-volatile memory devices in which a word line driver size is reduced. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
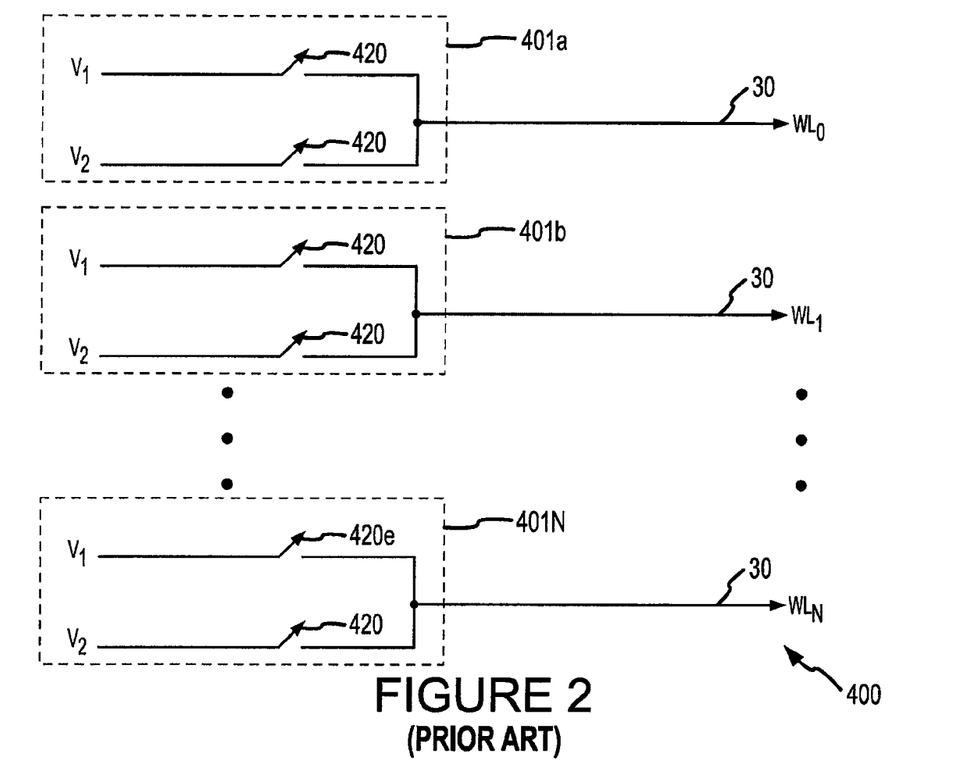
FIG. 2 is a schematic diagram showing the manner in which a prior art word line driver requires a large number of switches to couple voltages to a row of flash memory cells.
Figure 3:
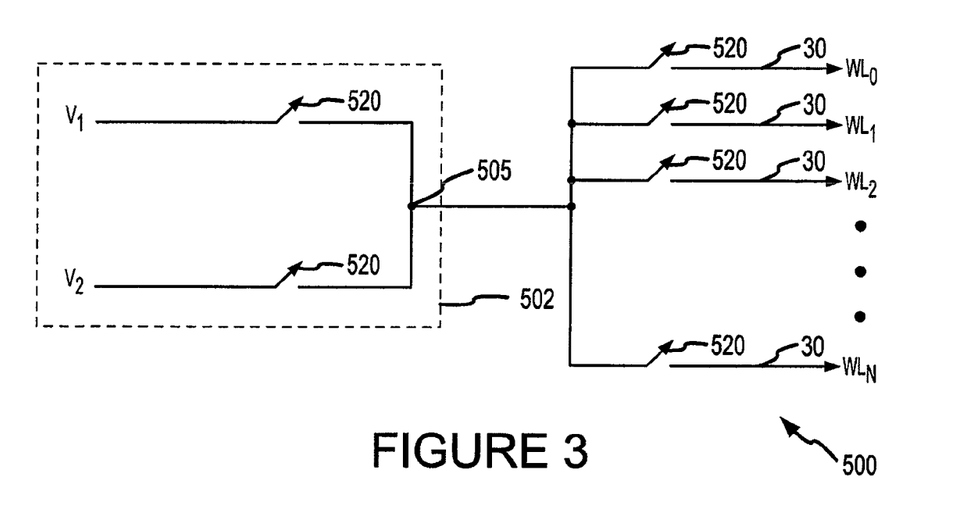
FIG. 3 is a schematic diagram showing the manner in which a word line driver according to an embodiment of the invention requires considerably fewer switches to couple voltages to a row of non-volatile memory cells

FIGS. 2 and 3 are provided to illustrate the design of a word line driver system 500 according to an embodiment of the invention. FIG. 2 shows a design of prior art word line driver system 400 using word line drivers 401 having switches 420 and voltage nodes $V_1$ and $V_2$ that are configured similarly to the prior art word line drivers 301 of FIG. 1. For simplicity, each word line driver 401 receives only two voltages $V_1$ and $V_2$, whose respective nodes are connected in parallel and coupled to the corresponding word line 30 $WL_N$. Therefore, a total of 2N voltage nodes are coupled to the word lines 30 through a total of 2N switches 420, where N is the number of word lines 30, and also the number of 401. For example, if N=32, a total of 64 voltage nodes and 64 switches 420 are utilized by all the drivers 401. It is apparent from FIG. 2 that as more voltage nodes are added to expand the range of voltage levels to the memory cells 14 or as more word lines 30 are included in the word line driver system 400 the number of switches 420 also increases proportionately.

A word line driver system 500 according to an embodiment of the invention is shown in FIG. 3. The system 500 differs in at least one manner from the prior art word line driver system 400 of FIG. 1 in that the size of the word line driver system 500 is much smaller, therefore the overall die size of the memory device is smaller. The nodes to the voltages $V_1$ and $V_2$ are eliminated from each of the drivers 401, and replaced by a single switch 520 that controls the voltage level selection applied to the respective word line 30. The voltages $V_1$ and $V_2$ are instead supplied to the word lines 30 by a single power multiplexer ("mux") circuit 502 that is coupled to all the word lines 30 by a node 505. Therefore, the 2N voltage nodes utilized by the drivers 401 in the prior art system 400 are reduced to only 2 nodes located in the power mux circuit 502, and the 2N switches 420 of the prior art system 400 is reduced to N+2 switches 520 in the word line driver system 500, eliminating N−2 switches 520. For example, if N=32, a total of 34 switches are utilized in the system 500 instead of the 64 switches in the prior art system 400, reducing the overall size of the chip by 30 switches.

Figure 4:
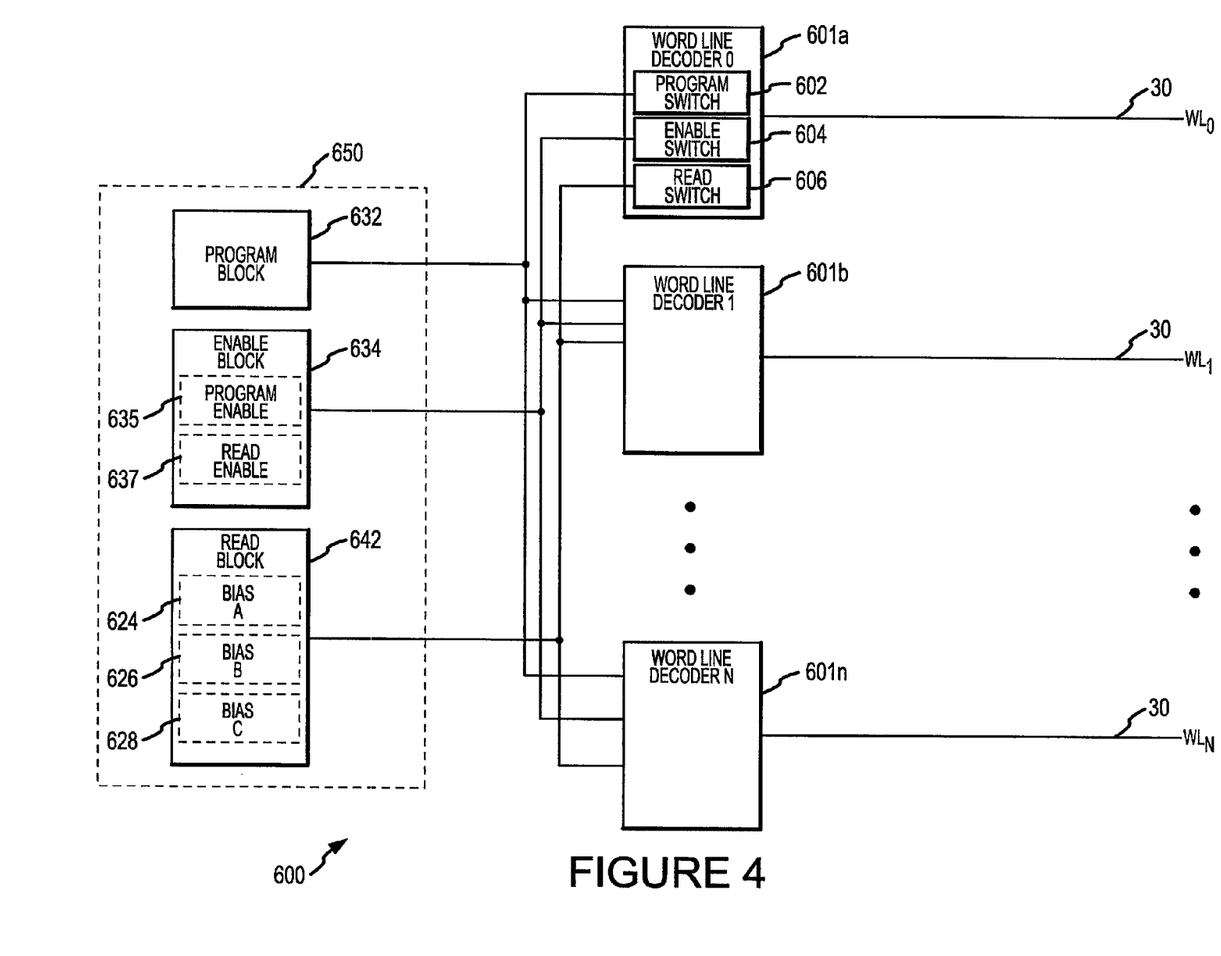
FIG. 4 is a block diagram of a word line driver system according to an embodiment of the invention.

A word line driver system 600 according to one embodiment of the invention is shown in FIG. 4. Similar to the word line driver system 500 of FIG. 3, the system 600 includes a single power mux circuit 650 from which all the voltages are supplied from a range of voltage levels. The power mux circuit 650 includes a program block 632, an enable block 634 having a program enable node 635 and a read enable node 637, and a read block 642 that includes three bias voltage nodes 624, 626, 628. The program block 632, the enable block 634, and the read block 642 operate in the same manner as the program block 302, enable block 304 and the read block 306 of FIG. 1 except that they do not supply their respective voltages to a word line. Therefore, in the interest of brevity, the structure and operation of the program block 632, the enable block 634, and the read block 642 will not be repeated. However, in contrast to the word line driver system 300, only a single program block 632, enable block 634, and read block 642 are needed for an entire block because they are placed only in the power mux circuit 650. The voltages generated by the blocks 632, 634, 642 depend on the nature of the memory operation. For a programming operation, the program block 632 outputs a program voltage, the enable block 634 outputs a program enable voltage from the program enable node 635, and the read block 642 does not output any voltage. For a read operation, the program block 632 does not output any voltage, the enable block 634 outputs a read enable voltage from the read enable node 637, and the read block 642 sequentially outputs respective read voltages from the bias voltage nodes.

In contrast to the drivers 301 in the system 300, the power mux circuit 650 supplies the voltages to a set of word line drivers 601 simplified to act only as a switch that selectively applies a voltage to the respective word line 30. As a result, the size of each driver 601 is substantially reduced. Each of the word line drivers 601 include a program switch 602 to couple the programming voltage to the word line 30 of a selected row of memory cells 14 during a program operation, an enable switch 604 to couple the programming or read enable voltage to the word line 30 of the unselected row of cells during either a program or read operation, and a read switch 606 to couple the bias voltages to the word line 30 of a selected row of memory cells 14 during a read operation.

Figure 5:
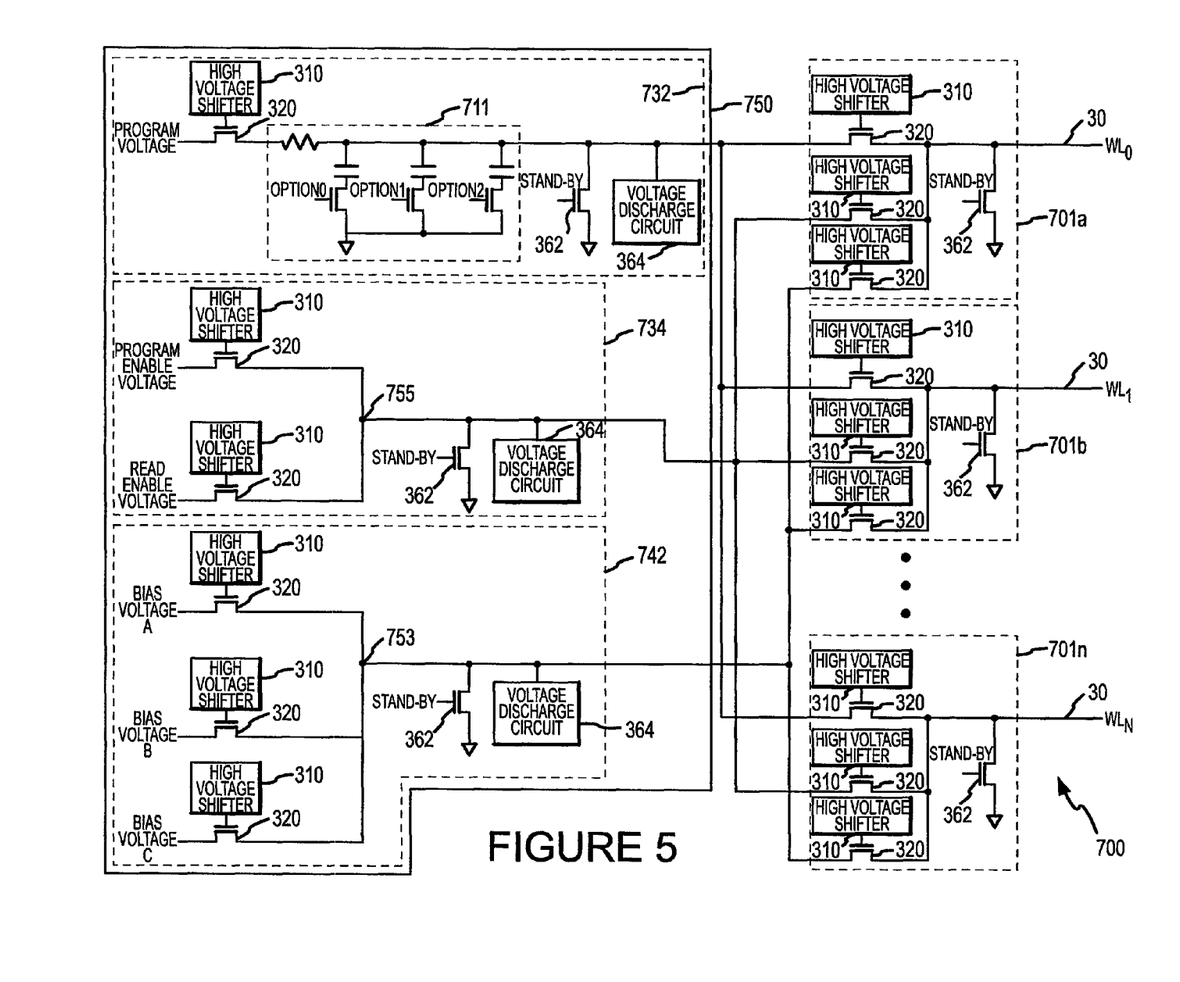
FIG. 5 is a more detailed block diagram of the word line driver system of FIG. 4 according to an embodiment of the invention.

FIG. 5 is a block diagram of a word line driver system 700 that includes a power mux circuit 750 and a word line driver 701 according to an embodiment of FIG. 4, but in greater detail. The word line driver system 700 includes many of the same components as the word line driver system 300 operating in the same manner and, in the interest of brevity, these same components will not be described again. The circuitry for each word line driver 701 includes NMOS transistors 320 that act as the switches 602, 604, 606 described above. The drivers 701 may also include a means to enable the transistors 320, such as the high voltage shifter 310, and the stand-by switch 362 that disables the row when the word line driver system 700 is inactive. All other auxiliary components are eliminated from the drivers 301, and instead placed once in a single location in the power mux circuit 750. Similar to the power mux circuit 650, the power mux circuit 750 includes a program block 732, an enable block 734 and a read block 742, each of which includes its own voltage discharge circuits 364, stand-by switches 362 and switches 320 to the voltage supply nodes that are controlled by the high voltage shifters 310. By categorizing each block according to function, the signal lines supplying voltages for a particular memory operation may be grouped in parallel and coupled to supply a single voltage to further simplify the power mux circuit 750. For example, since there are multiple voltages for a read operation, all the signal lines to supply the bias voltages A, B, C are organized in parallel to share a node 753. The selected bias voltage is then applied to the node 753 by activating the corresponding switch 320. Similarly, since the word line driver system 700 is in either a program operation, a read operation or an erase operation, the program enable voltage and the read enable voltage are configured in parallel and share a node 755 to which only one voltage is applied at one time. Only one program voltage is needed, but auxiliary components may be included in the program block 732. Since only one power mux circuit 750 is needed for the entire word line driver system 700, the circuit may be complex, and designed to include optional features without encountering a significant die-size penalty. For example, the program block 732 may include multiple low-pass filter elements 711 to optionally provide varying filter bandwidths without significantly increasing the die size. Alternatively, the read block 742 may include additional bias voltages to access an increased number of bits stored in the memory cells 14.

In summary, the word line driver system 700 significantly reduces the size of the drivers 701 in three respects. First, using an analysis similar to describing the number of switches reduced in the system 500 of FIG. 3, six of the transistors 320 in each of the drivers 301 of FIG. 1 are reduced to three in each of the drivers 701 in FIG. 5, but six transistors 320 are utilized once by the power mux circuit 750. If N is the total number of drivers 701 in the system 700, then the 6N transistors 320 of the prior art drivers 301 are reduced to 3N+6 transistors 320 due to the drivers 701 and power mux circuit 750 in the system 700, reducing the overall number of transistors by 3N−6. Additionally, 3N−6 of the high voltage shifters 310 that correspond to 3N−6 transistors 320 are also eliminated. In another respect, the N number of low pass filters 311 in the drivers 301 are replaced by one low pass filter 711 in the program block 732, eliminating the number of filters by N−1. Finally, in a similar manner, the voltage discharge circuits 364 are eliminated from the drivers 301 and utilized once in each of the blocks 732, 734, 742 of the power mux circuit 750, consequently reducing the number of voltage discharge circuits 364 by N−3. By reducing the total number of transistors 320 and auxiliary circuits, such as the low pass filters 711 and the voltage discharge circuits 364, the die size of the system 700 is notedly reduced.

Figure 6:
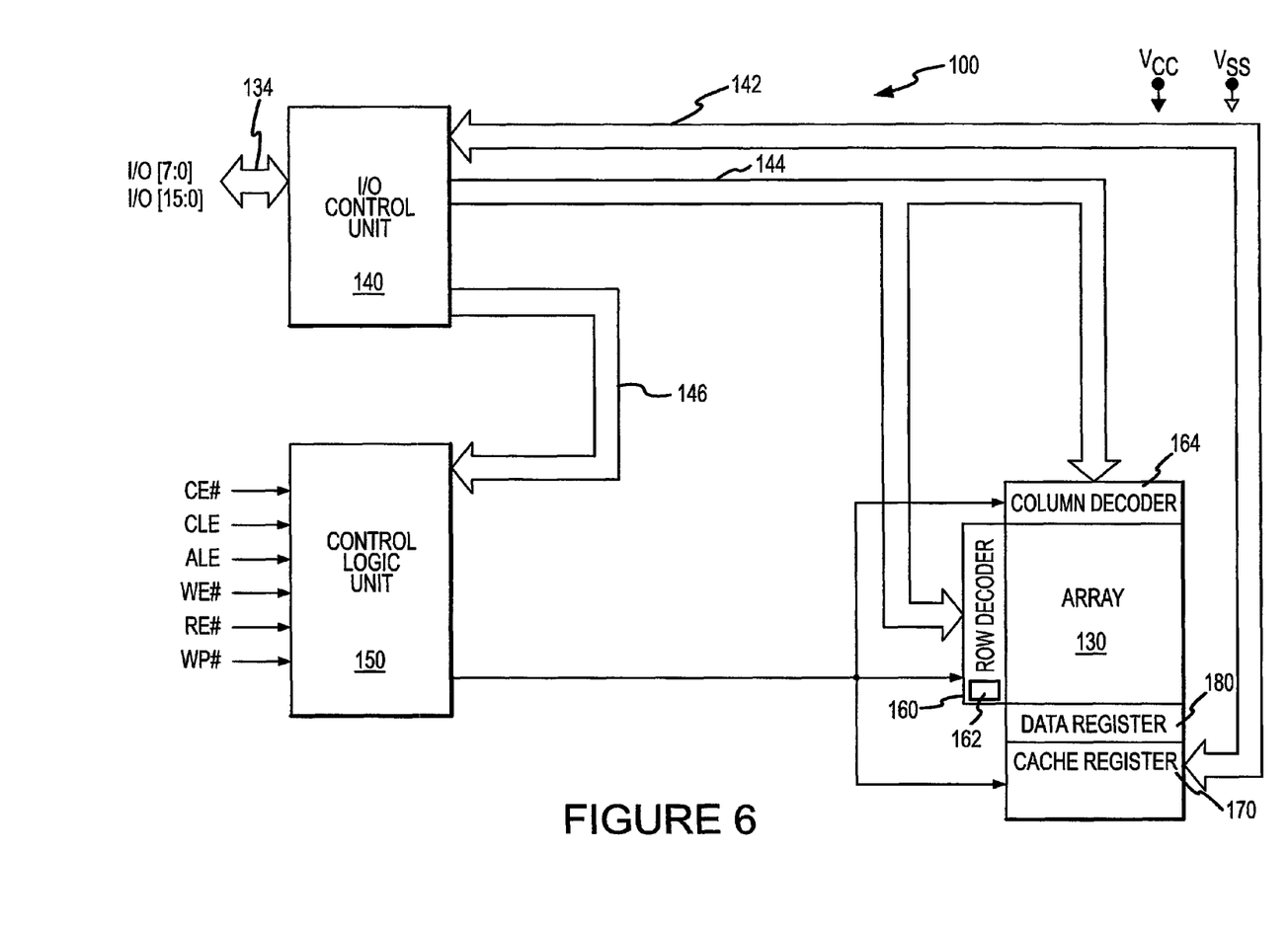
FIG. 6 is a block diagram showing a flash memory device having a row decoder that includes a word line driver system according to an embodiment of the invention.

A flash memory device 100 that includes the word line driver system according to one embodiment of the invention is shown in FIG. 6. The flash memory device 100 includes an array 130 of flash memory cells arranged in banks of rows and columns.

Most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an internal address bus 144, and an internal command bus 146. The flash memory device 100 also includes a control logic unit 150 that receives a number of control signals either externally or through the command bus 146 to control the operation of the memory device 100. The address bus 144 applies row address signals to a row decoder 160 and column address signals to a column decoder 164. The row decoder 160 includes a word line driver system 162, which may be the word line driver system 700 or a word line driver system according to another embodiment of the invention, which drives the word lines 30 with appropriate voltages corresponding to the decoded row address signals and the type of memory operation. As described above, the word line driver system 162 minimizes the overall circuitry of the row decoder 160 to minimize the die size of the memory device 100. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been applied to the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address coupled through the address bus 144. In a similar manner, during a read operation, data signals from a row or page of memory cells selected by the row address coupled through the address bus 144 are stored in a data register 180. Sets of data signals corresponding in size to the width of the I/O bus 134 are then sequentially transferred through the I/O control unit 140 from the data register 180 to the I/O bus 134.

Figure 7:
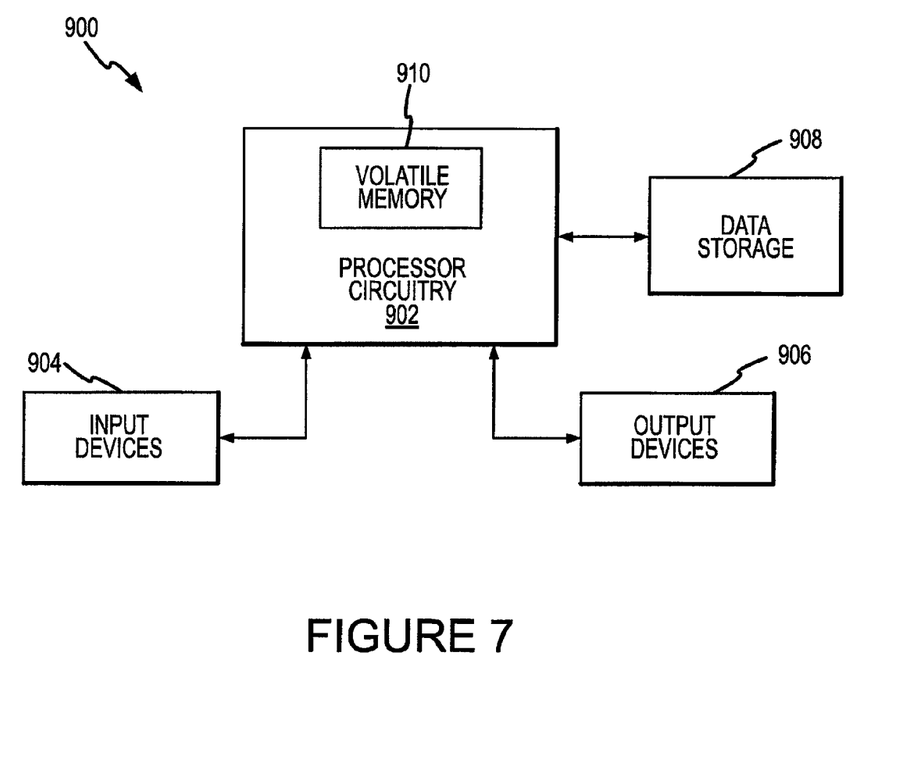
FIG. 7 is a simplified block diagram of a processor-based system including the flash memory device of FIG. 6.

FIG. 7 is a block diagram of a processor-based system 900 including processor circuitry 902 having a volatile memory 910 of FIG. 6. The processor circuitry 902 is coupled through address, data, and control buses to the volatile memory 910 to provide for writing data to and reading data from the volatile memory 910. The processor circuitry 902 includes circuitry for performing various processing functions, such as executing specific software to perform specific calculations or tasks. The processor-based system 900 also includes one or more input devices 904 coupled to the processor circuitry 902 to allow an operator to interface with the processor-based system 900. Examples of input devices 904 include keypads, touch screens, and scroll wheels. The processor-based system 900 also includes one or more output devices 906 coupled to the processor circuitry 902 to provide output information to the operator. In one example, the output device 906 is a visual display providing visual information to the operator. Data storage 908 is also coupled to the processor circuitry 902 to store data that is to be retained even when power is not supplied to the processor-based system 900 or to the data storage 908. The flash memory device 100, or a flash memory device according to some other example of the invention, can be used for the data storage 908.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A method of applying a voltage on a word line of an array of non-volatile memory cells in a non-volatile memory device, the method comprising:
    selecting one of at least two voltages to provide as an output signal depending upon the nature of an operation being performed by the non-volatile memory device; and
    selectively applying the output signal to the word line in the non-volatile memory device.

2. The method of claim 1 wherein the act of selectively applying the output signal to the respective word line comprises selectively applying the output signal to the respective word line responsive to receiving a row address.

3. The method of claim 1 wherein the act of selecting one of at least two voltages to provide as an output signal comprises:
supplying a programming voltage as the output signal during a programming operation;
supplying one of at least two bias voltages as the output signal during a read operation; and
supplying one of at least two enable voltages as the output signal to enable either a programming operation or a reading operation.

4. The method of claim 3 further comprising:
storing at least one bit of data from a predetermined number of data bits in a selected row of memory cells during a programming operation; and
supplying one of a plurality of bias voltages during a reading operation to read the stored at least one bit of data, wherein each one of the plurality of bias voltages corresponds to each of the predetermined number of data bits.

5. The method of claim 1 further comprising gradually discharging the filtered output voltage signal from the respective word line after the memory operation is complete.

6. The method of claim 1 further comprising disabling the word lines when the array of the non-volatile memory cells are inactive.

7. A method of applying a voltage on a word line of an array of non-volatile memory cells in a non-volatile memory, the method comprising:
filtering a voltage to generate a filtered output voltage signal; and
selectively applying the filtered output voltage to the word line in the non-volatile memory device.

8. The method of claim 7 wherein the filtered voltage comprises one of at least two different voltages.

9. The method of claim 8 wherein the at least two different voltages correspond to different levels of charge stored in the non-volatile memory cells connected to a word line to which the at least two different voltages are coupled.

10. The method of claim 7 further comprising gradually discharging the filtered output voltage signal from the respective word lines of the memory cells.

11. The method of claim 7 wherein the act of filtering the selected one of at least two voltages comprises selecting a combination of low pass filters from a predetermined number of low pass filters to configure a delay time from a predetermined range of delay times corresponding to the predetermined number of low pass filters.

12. The method of claim 7 further comprising disabling the word lines when the array of the non-volatile memory cells are inactive.

13. A method of applying a voltage on a word line of an array of non-volatile memory cells in a non-volatile memory device, the method comprising:
selecting a voltage from a range of voltage levels to be provided to a plurality of word lines, the word line included in the plurality of word lines, the voltage selected based at least in part on the nature of a memory operation performed;
selectively applying the provided voltage to the word line.

14. The method of claim 13 wherein selecting a voltage from a range of voltage levels comprises selecting a program voltage for a programming operation.

15. The method of claim 13 wherein selecting a voltage from a range of voltage levels comprises selecting a read voltage for a read operation.

16. The method of claim 13 wherein selectively applying the provided voltage to the word line comprises activating a transistor coupled to the word line to be conductive and couple the provided voltage to the word line.

17. The method of claim 16 wherein activating the transistor comprises applying a high-voltage to a gate of the transistor.

18. The method of claim 13, further comprising filtering the voltage provided to the plurality of word lines.

19. The method of claim 18 wherein filtering the voltage provided to the plurality of word lines comprises selecting one of various filter bandwidths to use in filtering the voltage provided.

20. The method of claim 13 wherein selecting a voltage from a range of voltage levels comprises:
selecting from program, enable, and read voltages;
selecting from a plurality of read voltages responsive to selecting read voltages; and
selecting from a plurality of enable voltages responsive to selecting enable voltages.

* * * * *